(12) United States Patent
Cheng et al.

(10) Patent No.: US 9,368,512 B1
(45) Date of Patent: Jun. 14, 2016

(54) DOUBLE DIAMOND SHAPED UNMERGED EPITAXY FOR TALL FINS IN TIGHT PITCH

(71) Applicant: International Business Machines Corporation, Armonk, NY (US)

(72) Inventors: Kangguo Cheng, Schnectady, NY (US); Alexander Reznicek, Troy, NY (US); Dominic J. Schepis, Wappingers Falls, NY (US); Charan V. V. S. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/729,871

(22) Filed: Jun. 3, 2015

(51) Int. Cl.
| H01L 27/12 | (2006.01) |
| H01L 21/8234 | (2006.01) |
| H01L 29/66 | (2006.01) |
| H01L 21/84 | (2006.01) |

(52) U.S. Cl.
CPC .... *H01L 27/1211* (2013.01); *H01L 21/823431* (2013.01); *H01L 21/823468* (2013.01); *H01L 21/823481* (2013.01); *H01L 21/845* (2013.01); *H01L 29/6653* (2013.01); *H01L 29/66545* (2013.01)

(58) Field of Classification Search
CPC ..................... H01L 29/66795; H01L 27/0886; H01L 21/823821
See application file for complete search history.

(56) References Cited

U.S. PATENT DOCUMENTS

| 8,796,093 | B1 | 8/2014 | Cheng et al. | |
| 8,878,300 | B1 | 11/2014 | Liu et al. | |
| 2013/0292777 | A1* | 11/2013 | Liaw | G11C 11/412 257/369 |
| 2014/0134814 | A1 | 5/2014 | Wong et al. | |
| 2014/0206169 | A1 | 7/2014 | Cha et al. | |
| 2014/0308782 | A1 | 10/2014 | Chan et al. | |
| 2015/0011068 | A1 | 1/2015 | Lin et al. | |
| 2015/0311335 | A1* | 10/2015 | Ching et al. | H01L 29/785 257/192 |

* cited by examiner

*Primary Examiner* — Marc Armand
*Assistant Examiner* — Shannon Yi
(74) *Attorney, Agent, or Firm* — Scully, Scott, Murphy & Presser, P.C.; Steven J. Meyers

(57) ABSTRACT

A semiconductor structure is provided that includes a semiconductor fin extending upwards from a surface of a substrate. A source/drain structure is located on each side of the semiconductor fin. The source/drain structure comprises an upper source/drain portion having a faceted topmost surface and located on an upper portion of the semiconductor fin, and a lower source/drain portion having a faceted topmost surface and located on a lower portion of the semiconductor fin. In accordance with the present application, upper source/drain portion of the source/drain structure is spaced apart from the lower source/drain portion of the source/drain structure by a dielectric spacer portion.

20 Claims, 9 Drawing Sheets

DOUBLE DIAMOND SHAPED UNMERGED EPITAXY FOR TALL FINS IN TIGHT PITCH

BACKGROUND

The present application relates to a semiconductor structure and a method of forming the same. More particularly, the present application relates to a semiconductor structure containing FinFET devices that have unmerged source/drain structures.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

The ever shrinking dimensions in future technologies requires tall (on the order of 50 nm or greater) semiconductor fins to meet current density per unit footprint requirements. At the same time, semiconductor fin pitch is also shrinking. Unmerged source/drain epitaxy has emerged as a front-up option compared to merged source/drain epitaxy.

Growing single step unmerged epitaxy source/drain structures on tall semiconductor fins with a tight pitch (on the order of 35 nm or less) cannot work due to geometric reasons, which will lead unavoidably to merged source/drain structures. One approach to formed unmerged source/drain structure by epitaxy includes covering a bottom portion of the semiconductor fins with a spacer and thereafter growing the source/drain structures by epitaxy on the upper portion of the semiconductor fins. Such a technique however leads to non-uniform dopant distribution since the dopant is present only at the top of the tall semiconductor fins.

In view of the above, there is a need for providing a method that can form epitaxial source/drain structures that avoid the drawbacks mentioned with prior art processes.

SUMMARY

In one aspect of the present application, a semiconductor structure is provided. In accordance with an embodiment of the present application, the semiconductor structure includes a semiconductor fin extending upwards from a surface of a substrate. A source/drain structure is located on each side of the semiconductor fin. Each source/drain structure comprises an upper source/drain portion having a faceted topmost surface and located on an upper portion of the semiconductor fin, and a lower source/drain portion having a faceted topmost surface and located on a lower portion of the semiconductor fin. In accordance with the present application, the upper source/drain portion of the source/drain structure is spaced apart from the lower source/drain portion of the source/drain structure by a dielectric spacer portion.

In some embodiments of the present application, the structure may further include at least one other semiconductor fin located adjacent to the semiconductor fin and on another surface of the substrate. The at least one other semiconductor fin comprises another source/drain structure including an another upper source/drain portion having a faceted topmost surface and located on an upper portion of the at least one other semiconductor fin, and another lower source/drain portion having a faceted topmost surface and located on a lower portion of the at least one other semiconductor fin. The another upper source/drain portion of the another source/drain structure is spaced apart from the another lower source/drain portion of the another source/drain structure by another dielectric spacer portion. The source/drain structure of the semiconductor fin and the another source/drain structure are unmerged.

In another aspect of the present application, a method of forming a semiconductor structure is provided. In accordance with an embodiment of the present application, the method includes providing a semiconductor fin extending upwards from a surface of a substrate. Next, a sacrificial structure is formed straddling a portion of the semiconductor fin. A dielectric spacer portion is then formed on a middle portion of each sidewall surface of the semiconductor fin not including the sacrificial structure. Next, a source/drain structure is epitaxially grown. Each source/drain structure that is epitaxially grown comprises an upper source/drain portion having a faceted topmost surface that is formed on an upper portion of the semiconductor fin not including the sacrificial structure, and a lower source/drain portion having a faceted topmost surface that is formed on a lower portion of the semiconductor fin not including the sacrificial structure. In accordance with the present application, the upper source/drain portion of the source/drain structure is spaced apart from the lower source/drain portion of the source/drain structure by the dielectric spacer portion.

DETAILED DESCRIPTION

Figure 1:
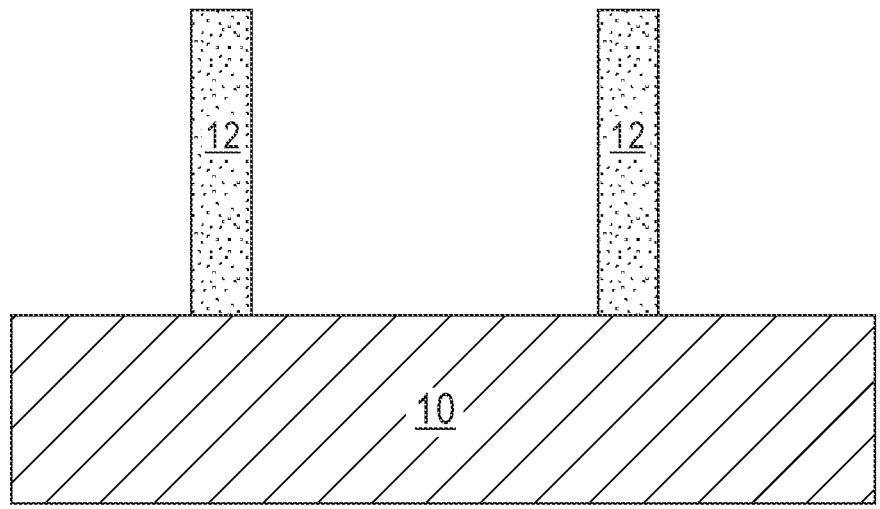
FIG. 1 is a cross sectional view of a first exemplary semiconductor structure including a plurality of semiconductor fins extending upwards from a surface of a substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated a first exemplary semiconductor structure including a plurality of semiconductor fins 12 extending upwards from a surface of a substrate 10 that can be employed in accordance with an embodiment of the present application. Although a plurality of semiconductor fins 12 are described and illustrated, the present application can be used when only a single semiconductor fin 12 is formed.

In some embodiments of the present application, substrate 10 can be a remaining semiconductor material portion of a bulk semiconductor substrate. In such an embodiment, substrate 10 can be comprised of any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate 10. In one embodiment and when substrate 10 is a remaining semiconductor material portion of a bulk semiconductor substrate, the substrate 10 can be comprised of a single crystalline semiconductor material, such as, for example, single crystalline silicon. In some embodiments, the crystal orientation of the remaining semiconductor portion of the bulk semiconductor substrate may be {100}, {110}, {111} or any other of the well known crystallographic orientations. In some embodiments and when substrate 10 is a remaining semiconductor material portion of a bulk semiconductor substrate, each semiconductor fin 12 may comprise a same semiconductor material, or a different semiconductor material, from substrate 10.

In another embodiment, substrate 10 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins 12 as shown in FIG. 1.

The handle substrate and the semiconductor layer of the SOI substrate may comprise the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material. In yet other embodiments, the handle substrate can be omitted and the substrate 10 includes only an insulator layer.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material.

The insulator layer of the SOI substrate and that can be employed as substrate 10 may be a crystalline or non-crystalline oxide and/or nitride. In one embodiment, the insulator layer is an oxide such as, for example, silicon dioxide. In another embodiment, the insulator layer is a nitride such as, for example, silicon nitride or boron nitride. In yet another embodiment, the insulator layer is a multilayered stack of, in any order, silicon dioxide and one of silicon nitride or boron nitride.

The SOI substrate may be formed utilizing standard processes including for example, SIMOX (Separation by IMplantation of OXygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 10 nm to 100 nm. Other thicknesses that are lesser than, or greater than, the aforementioned thickness range may also be used as the thickness of the semiconductor layer of the SOI substrate. The insulator layer of the SOI substrate may have a thickness from 1 nm to 200 nm. Other thicknesses that are lesser than, or greater than, the aforementioned thickness range can also be employed as the insulator layer. The thickness of the handle substrate of the SOI substrate is inconsequential to the present application.

The first exemplary semiconductor structure shown in FIG. 1 can be formed by first providing a bulk semiconductor substrate (as defined above) or a SOI substrate (as defined above). After providing the bulk semiconductor substrate or the SOI substrate, a patterning process is used to define the plurality of semiconductor fins 12.

In one embodiment of the present application, the patterning process comprises a sidewall image transfer (SIT) process. The SIT process includes forming a contiguous mandrel material layer (not shown) on a topmost surface of either the bulk semiconductor substrate described above or the semiconductor layer of the SOI substrate described above. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers partially through an upper semiconductor material portion of the bulk semiconductor substrate, or entirely through the semiconductor layer of the SOI substrate and stopping on the insulator layer. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process can include lithography and etching. Lithography includes forming a photoresist material (not shown) on a topmost surface of either the bulk semiconductor substrate described above or the semiconductor layer of the SOI substrate described above. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

Each semiconductor fin 12 that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 12 that is formed has a height from 10 nm to 100 nm, and a width from 5 nm to 30 nm. Other heights and widths that are lesser than, or greater than, the aforementioned ranges may also be used in the present application for each semiconductor fin 12. When multiple semiconductor fins are present, each semiconductor fin is separated from its nearest neighboring semiconductor fin by a pitch that is from 20 nm to 60 nm; the pitch can be measured from a central portion of one semiconductor fin to a central portion of the nearest neighboring semiconductor fin. Each semiconductor fin 12 includes one of the semiconductor materials mentioned above for the bulk semiconductor substrate or the semiconductor layer of the SOI substrate. In embodiments in which substrate 10 is an insulator layer, there is a material interface present between the bottommost surface of each semiconductor fin 12 and the topmost surface of the insulator layer. In embodiments in which a bulk semiconductor substrate is used and the entire bulk semiconductor substrate comprises a single semiconductor material, no material interface is located between the bottommost surface of each semiconductor fin 12 and a topmost surface of a remaining semiconductor material portion of the bulk semiconductor substrate that can provide substrate 10.

Figure 2:
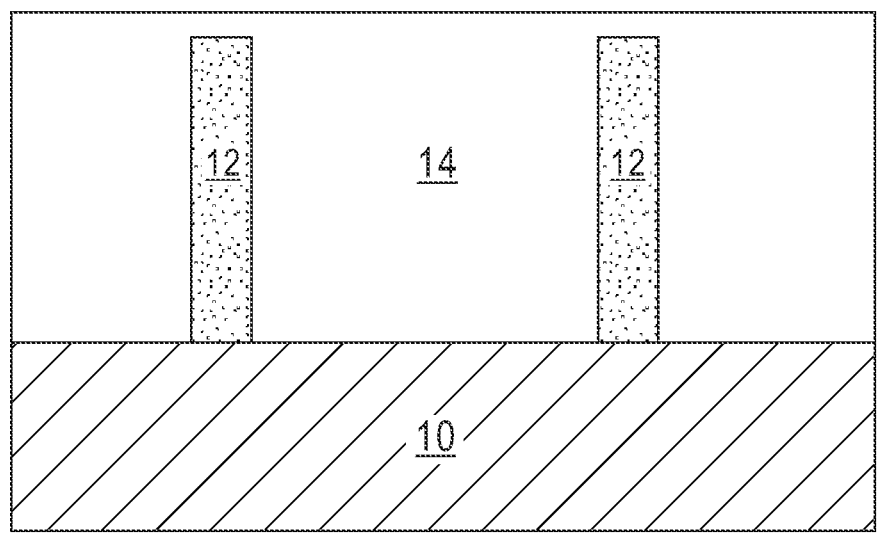
FIG. 2 is a cross sectional view of the first exemplary semiconductor structure of FIG. 1 after forming a sacrificial structure that straddles a portion of each semiconductor fin, while leaving other portions of each semiconductor fin exposed.

Referring now to FIG. 2, there is illustrated the first exemplary semiconductor structure of FIG. 1 after forming a sacrificial structure 14 that straddles a portion of each semiconductor fin 12, while leaving other portions of each semiconductor fin 12 exposed. In the drawing, the sacrificial structure 14 is present in the background and the semiconductor fins 12 are in front of, and behind, the sacrificial structure 14. Each semiconductor fin 12 passes through a portion of the sacrificial structure 14. As known to those skilled in the art, the non-protected portions of each semiconductor fin 12 are in the source/drain regions of the exemplary semiconductor structure of the present application. The sacrificial structure 14 thus protects a gate region of the exemplary semiconductor structure of the present application during the processing of the source/drain regions of the exemplary semiconductor structure. Although a single sacrificial structure 14 is described and illustrated, a plurality of sacrificial structures can be formed on different portions of each semiconductor fin 12.

The sacrificial structure 14 includes a single sacrificial material layer or a stack of two or more sacrificial materials (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation, may be used.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material is formed. The sacrificial gate cap material may an oxide and/or nitride. The sacrificial gate cap material can be formed utilizing one of the deposition techniques mentioned above for forming sacrificial gate dielectric material.

After providing the above mentioned sacrificial material stack (or any subset of said sacrificial materials), lithography and etching can be used to pattern the sacrificial material stack (or any subset of said sacrificial materials) and to provide the sacrificial structure 14. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

Figure 3:
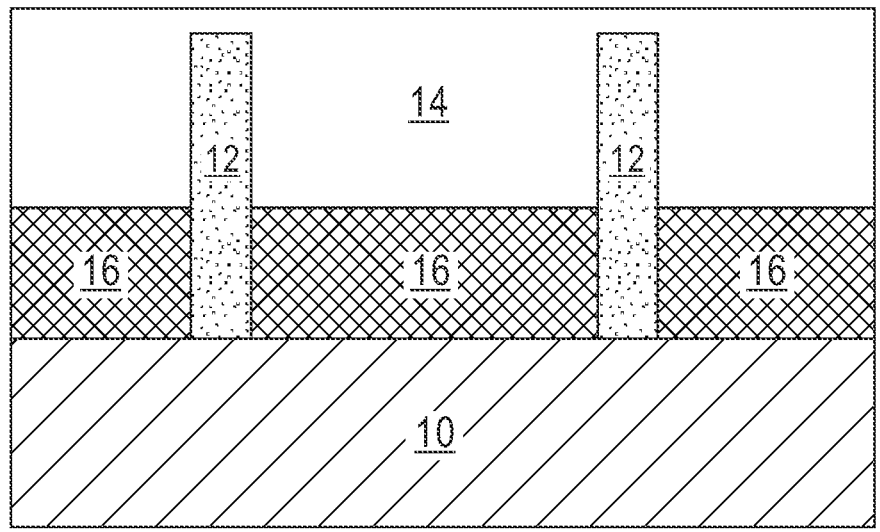
FIG. 3 is a cross sectional view of the first exemplary semiconductor structure of FIG. 2 after forming an isolation structure on a portion of the substrate and in contact with a sidewall surface of the sacrificial structure and sidewall surfaces of each semiconductor fin.

Referring now to FIG. 3, there is illustrated the first exemplary semiconductor structure of FIG. 2 after forming an isolation structure 16 on a portion of the substrate 10 and in contact with a sidewall surface of the sacrificial structure 14 and sidewall surfaces of each semiconductor fin 12. The isolation structure 16 is formed at the footprint of each semiconductor fin 12. The isolation structure 16 that is formed has a height that is less than the height of each semiconductor fin 12 and a height of the sacrificial structure 14. The isolation structure 16 comprises a trench dielectric material such as, for example, an oxide or a nitride. The trench dielectric material that provides the isolation structure 16 may, or may not, be the same as the insulator layer that may provide substrate 10.

The trench dielectric material can be formed by a deposition process including, for example, chemical vapor deposition or plasma enhanced chemical vapor deposition. The deposition process may overfill each gap located between each semiconductor fin 12 and may form above the topmost surface of the sacrificial structure 14. In such an embodiment, a planarization process such as, for example, chemical mechanical polishing and/or grinding may be first used to reduce the height of the deposited trench dielectric material to a height of the topmost surface of the sacrificial structure 14. After planarization, an etch back process can be used to form the isolation structure 16. In yet another embodiment, the deposition process may not provide a trench dielectric material that extends above the topmost surface of the sacrificial structure 14 or the topmost surface of each semiconductor fin 12. In such an embodiment, a recess etch may, or may not, be employed to provide the isolation structure 16.

Figure 4:
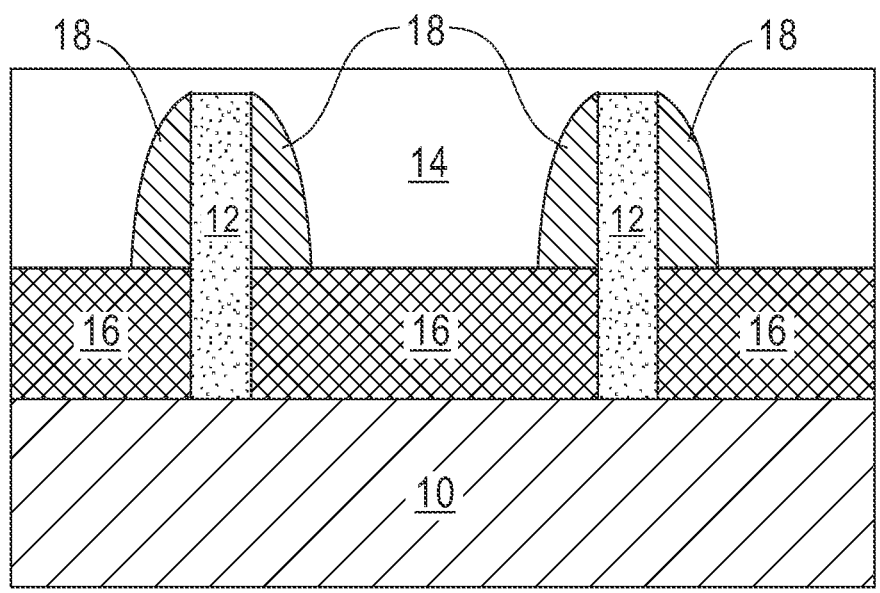
FIG. 4 is a cross sectional view of the first exemplary semiconductor structure of FIG. 3 after forming a dielectric spacer on an upper portion of exposed sidewall surfaces of each semiconductor fin.

Referring now to FIG. 4, there is illustrated the first exemplary semiconductor structure of FIG. 3 after forming a dielectric spacer 18 on an upper portion of exposed sidewall surfaces of each semiconductor fin 12 and in the source/drain region of the first exemplary semiconductor structure; no dielectric spacer 18 is present within the gate region that is protected by the sacrificial structure 14. Each dielectric spacer 18 that is formed has a base, i.e., bottommost surface, that is located on a portion of a topmost surface of the isolation structure 16. A portion of each dielectric spacer 18 may also directly contact a sidewall surface of sacrificial structure 14. Each dielectric spacer 18 that is formed has a lower portion of a first width and an upper portion of a second width that is less than the first width.

Each dielectric spacer 18 can be formed by first providing a dielectric spacer material and then etching the dielectric spacer material. In some embodiments of the present application, the dielectric spacer material has a different etch rate than both the sacrificial structure 14 and isolation structure 16. Examples of dielectric spacer materials that may be employed in the present application include dielectric oxides, dielectric nitrides and/or dielectric oxynitrides. In one embodiment, the dielectric spacer material used in providing each dielectric spacer is composed of silicon nitride. The dielectric spacer material may be provided by a deposition process including, for example, chemical vapor deposition (CVD), plasma enhanced chemical vapor deposition (PECVD), or physical vapor deposition (PVP). The etch used to provide each dielectric spacer 18 may comprise a dry etching process such as, for example, reactive ion etching.

Figure 5:
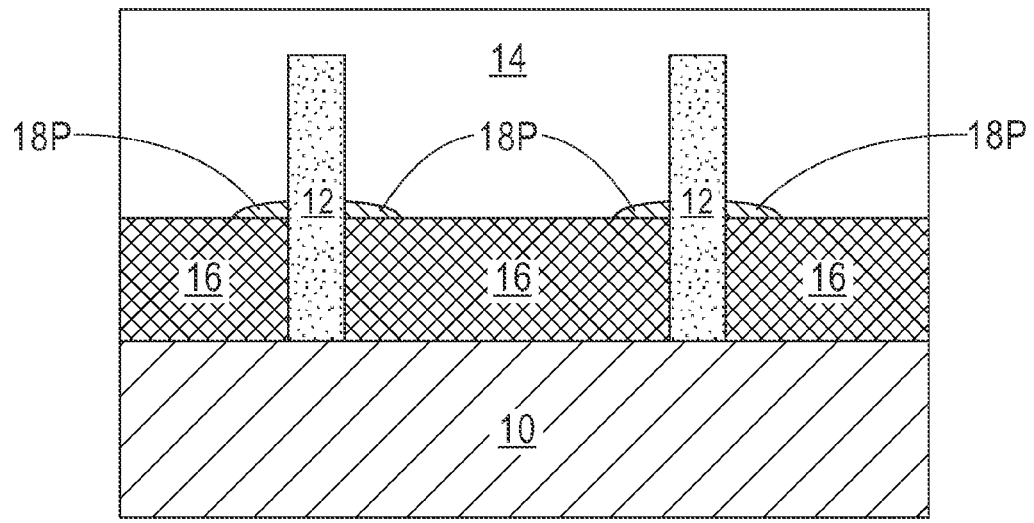
FIG. 5 is a cross sectional view of the first exemplary semiconductor structure of FIG. 4 after recessing a portion of each dielectric spacer to expose an upper portion of each semiconductor fin.

Referring now to FIG. 5, there is illustrated the first exemplary semiconductor structure of FIG. 4 after recessing a portion of each dielectric spacer 18 to expose a topmost portion of each semiconductor fin 12 that is located in the source/drain regions. The remaining portion of each dielectric spacer 18 may be referred to herein as a dielectric spacer portion 18P. Each dielectric spacer portion 18P has a base that is present on a portion of the topmost surface of the isolation structure 16. Each dielectric spacer portion 18P also covers a middle portion of each sidewall surface of each semiconductor fin 12 within the source/drain regions. That is, each dielectric spacer portion 18P has a surface that directly contacts a middle portion of each sidewall surface of each semiconductor fin 12 and extends outwards from the middle portion of the semiconductor fin 12.

The exposed portion of each semiconductor fin 12 that is located above each dielectric spacer portion 18P may be referred to herein as an upper portion. Each upper portion of the semiconductor fin 12 has sidewall surfaces and a topmost surface that are exposed and can be used for subsequent growth of an upper source/drain portion of a source/drain structure. The exposed portion of each semiconductor fin 12 that is located beneath each dielectric spacer portion 18P may be referred to herein as a lower portion. Each lower portion of the semiconductor fin 12 has sidewall surfaces that are covered by the isolation structure 16.

The recessing used to provide the dielectric spacer portion 18P includes an etch (wet or dry) that is selective in removing a portion of each dielectric spacer 18. In one example, phosphoric acid can be used as a chemical etchant in providing each dielectric spacer portion 18P. In another example, a timed reactive ion etch can be used in removing a portion of each dielectric spacer 18.

Figure 6:
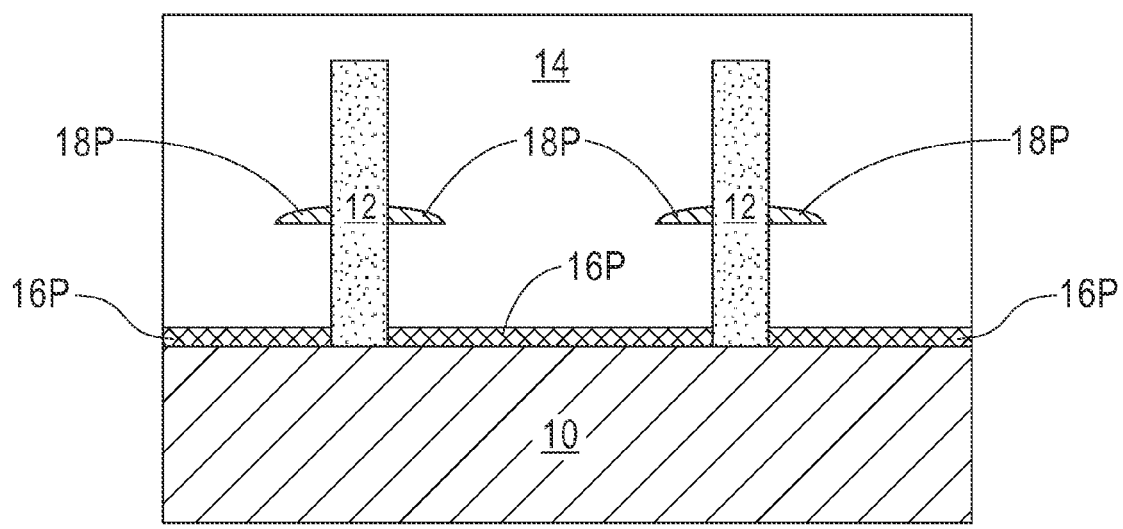
FIG. 6 is a cross sectional view of the first exemplary semiconductor structure of FIG. 5 after recessing the isolation structure.

Referring now to FIG. 6, there is illustrated the first exemplary semiconductor structure of FIG. 5 after recessing the isolation structure 16. This recessing step exposes sidewall surfaces of each lower portion such that a lower source/drain portion of a source/drain structure can be subsequently grown therefrom. After recessing, a portion of the isolation structure 16 remains. The remaining isolation structure may be referred to herein an isolation structure portion 16P. The isolation structure portion 16P has a height that is less than the height of the isolation structure 16 prior to the recessing.

The recessing is performed utilizing an etching process that is selective in removing the trench dielectric material that provides the isolation structure 16. In one embodiment, the recess etch may be performed utilizing either hydrofluoric acid or a buffered oxide etchant (i.e., a mixture of ammonia fluoride and hydrofluoric acid).

Figure 7:
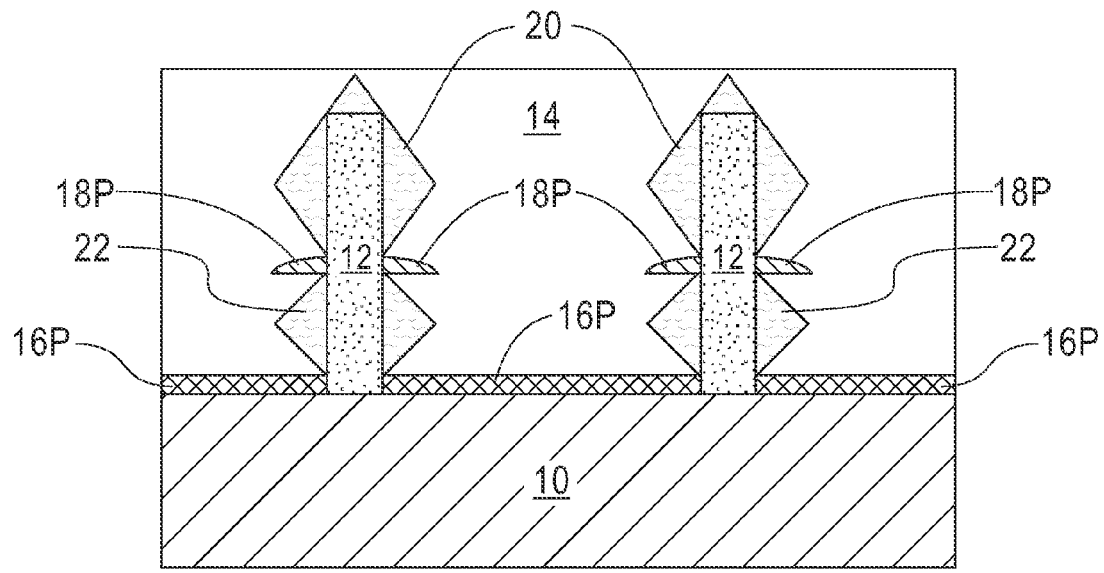
FIG. 7 is a cross sectional view of the first exemplary semiconductor structure of FIG. 6 after forming source/drain structures that include an upper source/drain portion and a lower source/drain portion that are separated by a remaining portion of the dielectric spacer.

Referring now to FIG. 7, there is illustrated the first exemplary semiconductor structure of FIG. 6 after forming source/drain structures that include an upper source/drain portion 20 and a lower source/drain portion 22 that are separated by a remaining portion of the dielectric spacer (i.e., dielectric spacer portion 18P). In accordance with an aspect of the present application, the source/drain structure (20, 22) of a semiconductor fin 12 does not merge with a source/drain structure (20, 22) of each nearest neighboring semiconductor fin 12. Also, each upper source/drain region 20 is spaced apart from a corresponding lower source/drain portion 22.

The upper source/drain portion 20 and the lower source/drain portion 22 have a faceted topmost surface. By "faceted topmost surface" it is meant that the topmost surface of the upper and lower source/drain portions 20, 22 are non-planar. In one embodiment of the present application, the upper source/drain portion 20 of each source/drain structure can be diamond shaped. The term "diamond shaped" is used throughout the present application to denote an epitaxial structure grown off (110)-fin sidewalls bounded by two (111) planes. In this embodiment, the upper source/drain portion 20 extends atop the exposed topmost surface of each semiconductor fin 12. The lower source/drain portion 22 of each source/drain structure can also be diamond shaped. Thus, and in some embodiments, the source/drain structures (20, 22) that are formed in the present application may be referred to as a double diamond shaped source/drain structure. The source/drain structures (20, 22) of the present application, including the double diamond shaped source/drain structures (20, 22), provide a more uniform dopant distribution along the sidewalls of each semiconductor fin 12 as compared to prior art approaches in which a spacer is formed at the bottom of each semiconductor fin prior to epitaxial formation of the source/drain structures. As is shown, a bottommost surface of each upper source/drain portion 20 of each source/drain structure contacts a topmost surface of a dielectric spacer portion 18P, while a topmost surface of each lower source/drain portion 22 contacts a bottommost surface of a dielectric spacer portion 18P.

The source/drain structure (20, 22) that is formed on one side of the sacrificial structure 14 provides a source structure of the first exemplary semiconductor structure of the present application, while the source/drain structure (20,22) that is formed on the other side of the sacrificial structure 14 forms a drain structure of the first exemplary semiconductor structure of the present application. Each source/drain structure (20, 22) comprises any semiconductor that includes an n-type or a p-type dopant. In some embodiments, each source/drain structure (20, 22) comprises a same semiconductor material as each semiconductor fin 12. In another embodiment, each source/drain structure (20, 22) comprises a different semiconductor material than each semiconductor fin 12.

The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate, examples of n-type dopants, i.e., impurities, include, but are not limited to, antimony, arsenic and phosphorous. The concentration of dopants within semiconductor material that provides the source/drain structure (20, 22) can be within ranges typically used in forming metal oxide semiconductor field effect transistors (MOSFETs).

The semiconductor material that provides each source/drain structure (20, 22) can be formed utilizing an epitaxial deposition process. The dopant can be introduced into the semiconductor material that provides each source/drain structure (20, 22) during the growth of the semiconductor material, or after growth of an intrinsic semiconductor utilizing gas phase doping.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, each source/drain structure (20, 22) has an epitaxial relationship, i.e., same crystal orientation, as that of the exposed surfaces of each semiconductor fin 12.

Examples of various epitaxial growth processes that are suitable for use in forming each source/drain structure (20, 22) include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of the source/drain structures (20, 22). In some embodiments, the source gas for the deposition of silicon germanium alloy source/drain structures (20, 22) includes a mixture of a silicon containing gas source and a germanium containing gas source or a combined silicon and germanium source gas may be used. In another embodiment, the source gas for the deposition of silicon source/drain structures (20, 22) includes a silicon containing gas source. Carrier gases like hydrogen, nitrogen, helium and argon can be used.

Figure 8:
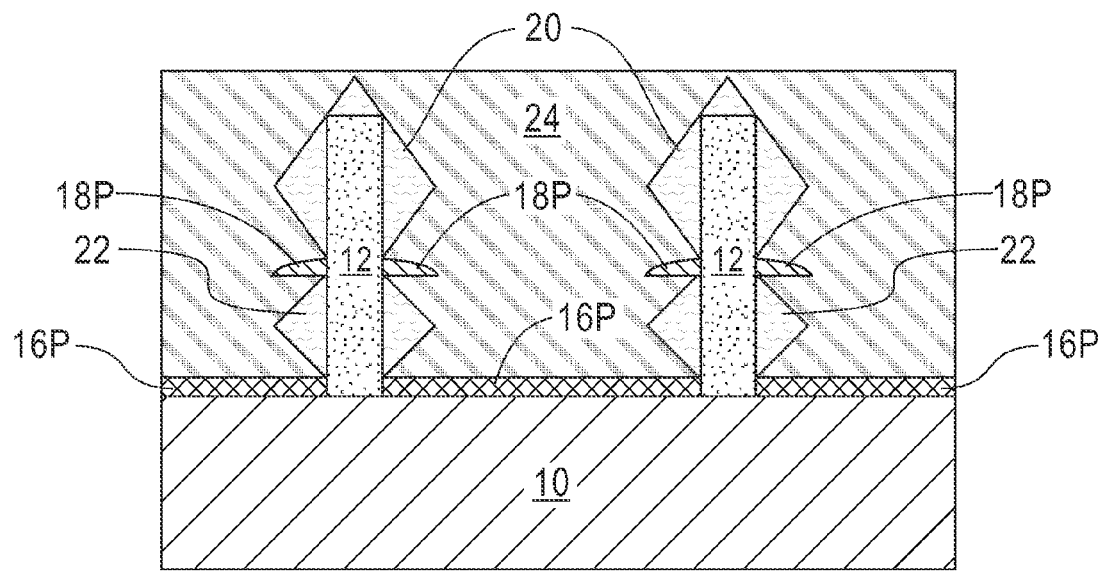
FIG. 8 is a cross sectional view of the first exemplary semiconductor structure of FIG. 7 after replacing the sacrificial structure with a functional gate structure.

Referring now to FIG. 8, there is illustrated the first exemplary semiconductor structure of FIG. 7 after replacing the sacrificial structure 14 with a functional gate structure 24. Prior to replacing the sacrificial structure 14 with a functional gate structure 24, an interlevel dielectric (ILD) material (not shown) is formed surrounding the sacrificial structure 14 and atop the source/drain structure (20, 22). The ILD material that is formed has a topmost surface that is coplanar with a topmost surface of the sacrificial structure 14.

In some embodiments, the ILD material may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the ILD material. The use of a self-planarizing dielectric material as the ILD material may avoid the need to perform a subsequent planarizing step.

In one embodiment, the ILD material can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material, a planarization process or an etch back process follows the deposition of the ILD material. The thickness of the ILD material that can be employed in the present application may vary depending on the type of dielectric material employed as well as the method that was employed in forming the same. In one embodiment, the ILD material has a thickness from 80 nm to 500 nm. Other thicknesses that are greater or lesser than the range provided above can also be used for the ILD material.

After forming the ILD material, the sacrificial structure 14 is removed from the gate region providing a gate cavity (not shown). The sacrificial structure 14 may be removed utilizing an etch process (or etching processes) that is (are) selective in removing the at least one sacrificial material portion that provides the sacrificial structure 14.

Next, a functional gate structure 24 is formed within the gate cavity. By "functional gate structure" it is meant a permanent gate structure used to control output current (i.e., flow of carriers in the channel) of a semiconducting device through electrical or magnetic fields. The functional gate structure 24 that is formed includes a gate material stack of, from bottom to top, a gate dielectric portion (not separately shown) and a gate conductor portion (also not separately shown). An optional gate cap portion (also not shown) may be present atop the gate conductor portion. Although a single functional gate structure 24 is described and illustrated, a plurality of a functional gate structures can be formed. Each functional gate structure that is formed straddles each semiconductor fin 12 that is present in the gate region. By "straddles", it is meant that one part of the functional gate structure is located on one side of each semiconductor fin 12, and another part of the functional gate structure 24 is located on another side of each semiconductor fin 12.

The gate dielectric portion of the functional gate structure 24 comprises a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion.

The gate dielectric material used in providing the gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when different functional gate structures are formed, a first set of functional gate structure may comprise a first gate dielectric portion, while a second set of functional gate structures may comprise a second gate dielectric portion that differs in composition from the first gate dielectric portion. When a different gate dielectric material is used for the gate dielectric portions, block mask technology can be used. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material.

The gate conductor portion of the functional gate structure 24 comprises a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, gate conductor portion may comprise an nFET gate metal. In other embodiments, gate conductor portion may comprise a pFET gate metal.

The gate conductor material used in providing the gate conductor portion 36 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of more than one functional gate structure, block mask technology can be used. In one embodiment, the gate conductor material used in providing the gate conductor portion has a thickness from 1 nm to 100 nm. Other thicknesses that are lesser than, or greater than, the aforementioned thickness range can also be employed for the gate conductor material used in providing the gate conductor portion.

If present, the gate cap portion comprises a gate cap material. The gate cap material that provides each gate cap portion may include a dielectric material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

The functional gate structure 24 can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

Figure 9:
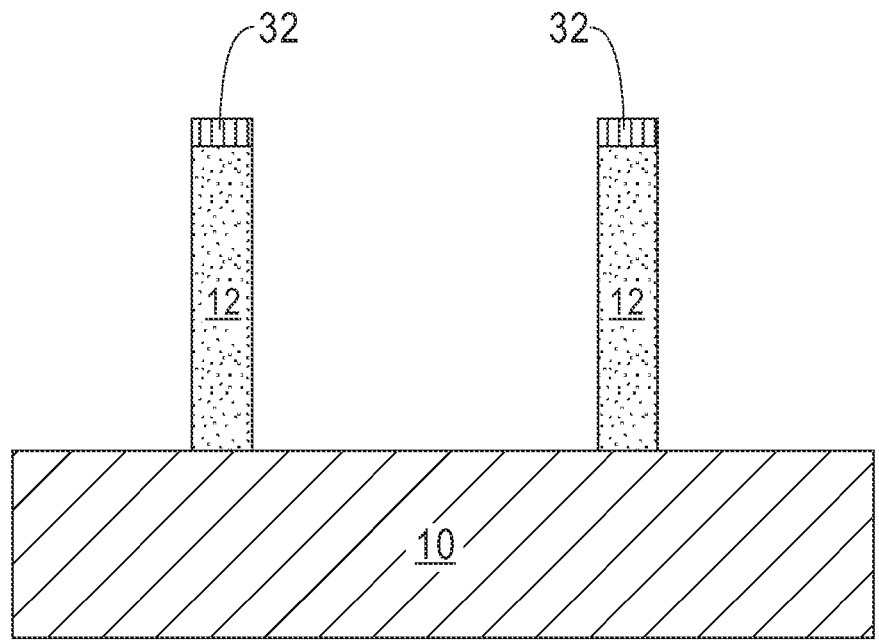
FIG. 9 is a cross sectional view of a second exemplary semiconductor structure including a plurality of semiconductor fins that are capped with a hard mask cap and that extend upwards from a surface of a substrate that can be employed in accordance with another embodiment of the present application.

Referring now to FIG. 9, there is illustrated a second exemplary semiconductor structure including a plurality of semiconductor fins 12 that are capped with a hard mask cap 32 and that extend upwards from a surface of a substrate 10 that can be employed in accordance with another embodiment of the present application. The second exemplary semiconductor structure shown in FIG. 9 can be prepared utilizing the processing mentioned above for providing the first exemplary semiconductor structure of FIG. 1 except that prior to patterning the bulk substrate or the SOI substrate, a hard mask layer is formed.

The hard mask layer that can be used in providing each hard mask cap 32 is a contiguous layer that covers an entirety of the underlying bulk semiconductor substrate or the SOI substrate. The hard mask layer that can be used in providing each hard mask cap 32 comprises at least one hard mask material. The hard mask material that can be employed in the present application as hard mask layer may include a semiconductor oxide, a semiconductor nitride and/or a semiconductor oxynitride. In one embodiment, the hard mask material that can be used in the present application as the hard mask layer may be comprised of silicon dioxide. In another embodiment, the hard mask material that can be used in the present application as the hard mask layer may be comprised of silicon nitride. In yet another embodiment, the hard mask material that can be used in the present application as the hard mask layer may include a hard mask stack of, in any order, silicon dioxide and silicon nitride.

In some embodiments, the hard mask material that can be used in the present application as the hard mask layer can be formed by a deposition process such as, for example, chemical vapor deposition (CVD) or plasma enhanced chemical vapor deposition (PECVD). In other embodiments, the hard mask material that can be used in the present application as the hard mask layer may be formed by a thermal process such as, for example, thermal oxidation and/or thermal nitridation. In yet other embodiments, the hard mask material that can be used in the present application as the hard mask layer may be formed by a combination of a deposition process and a thermal process. The thickness of the hard mask material that can be used in the present application as the hard mask layer may range from 5 nm to 20 nm. Other thicknesses that are lesser than, or greater than, the aforementioned thickness range may also be used as the thickness of hard mask layer.

After forming the hard mask layer atop the bulk semiconductor substrate or the SOI substrate, one of the patterning processes mentioned above can be used to provide the second exemplary semiconductor structure shown in FIG. 9. Each hard mask cap 32 represents a remaining (i.e., not etched) portion of the original hard mask layer described above.

Figure 10:
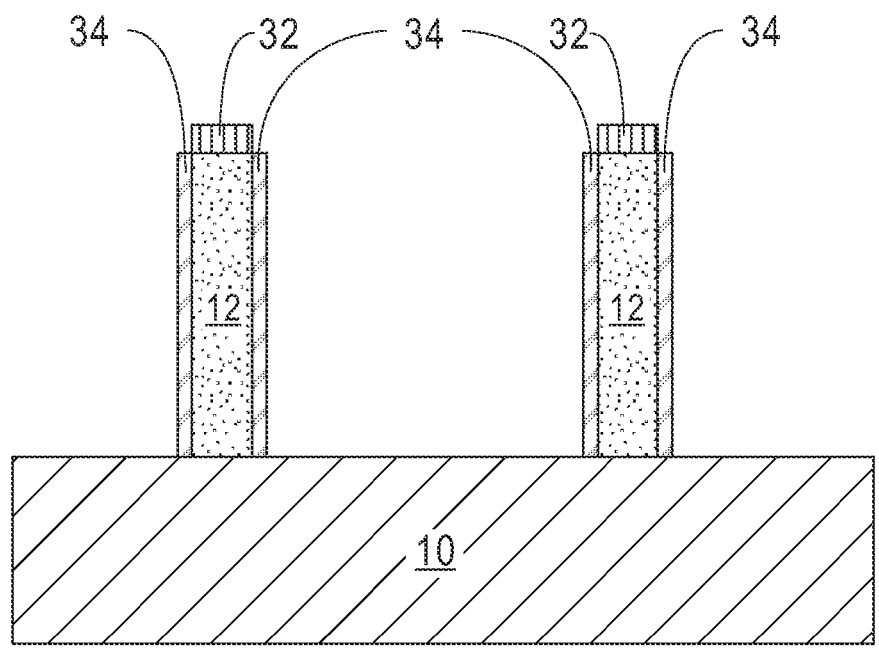
FIG. 10 is a cross sectional view of the second exemplary semiconductor structure of FIG. 9 after forming a sacrificial dielectric liner on sidewall surfaces of each semiconductor fin.

Referring now to FIG. 10, there is illustrated the second exemplary semiconductor structure of FIG. 9 after forming a sacrificial oxide liner 34 on sidewall surfaces of each semiconductor fin 12. The sacrificial oxide liner 34 typically comprises a different dielectric material than the dielectric spacers 18 to be subsequently formed. In one embodiment of the present application, the sacrificial oxide liner 34 comprises an oxide of the semiconductor material of each semiconductor fin 12. For example, and when each semiconductor fin 12 comprises silicon, the sacrificial oxide liner 34 comprises silicon dioxide. In yet another embodiment, the sacrificial oxide liner 34 may be a metal oxide. In some embodiments, the sacrificial oxide liner 34 may be formed utilizing a thermal oxidation process. In yet other embodiments, the sacrificial oxide liner 34 may be formed by a deposition process. Although not shown, a portion of the sacrificial oxide liner 34 can be formed atop the exposed surfaces of substrate 10. In such cases, an anisotropic etch may be used to remove the sacrificial oxide liner 34 from the surface of substrate 10. The thickness of the sacrificial oxide liner 34 may be from 1 nm to 20 nm. Other thicknesses that are lesser than, or greater than, the aforementioned thickness range may also be used as the thickness of the sacrificial oxide liner 34.

Figure 11:
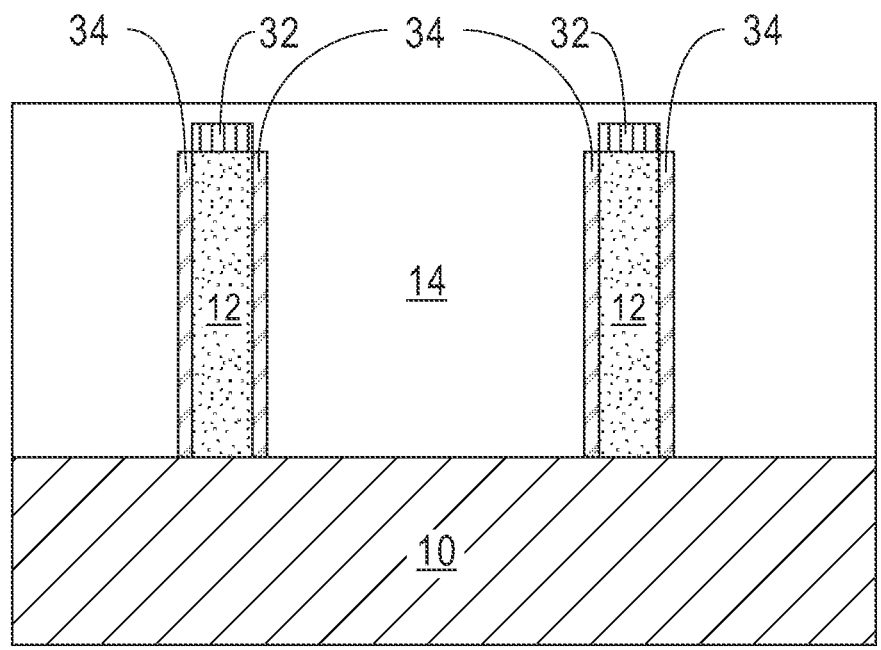
FIG. 11 is a cross sectional view of the second exemplary semiconductor structure of FIG. 10 after forming a sacrificial structure that straddles a portion of each semiconductor fin, while leaving other portions of each semiconductor fin exposed.

Referring now to FIG. 11, there is illustrated the second exemplary semiconductor structure of FIG. 10 after forming a sacrificial structure 14 that straddles a portion of each semiconductor fin 12, while leaving other portions of each semiconductor fin 12 exposed. The sacrificial structure 14 of this embodiment of the present application is the same as the sacrificial structure 14 that was described above in providing the first exemplary semiconductor structure shown in FIG. 2. Thus, the materials and processing technique mentioned above for providing the sacrificial structure 14 to the first exemplary semiconductor structure shown in FIG. 2 can be used here in providing the sacrificial structure 14 to the second exemplary semiconductor structure shown in FIG. 11. In this embodiment, the sacrificial structure 14 has a height that is located above the topmost surface of each hard mask cap 32.

In the drawing, the sacrificial structure 14 is present in the background and the semiconductor fins 12 are in front of, and behind, the sacrificial structure 14. As known to those skilled in the art, the non-protected portions of each semiconductor material 12 are in the source/drain regions of the exemplary semiconductor structure of the present application. The sacrificial structure 14 thus protects a gate region of the exemplary semiconductor structure of the present application during the processing of the source/drain regions of the exemplary semiconductor structure. Although a single sacrificial structure 14 is described and illustrated, a plurality of sacrificial structures can be formed on different portions of each semiconductor fin 12.

Figure 12:
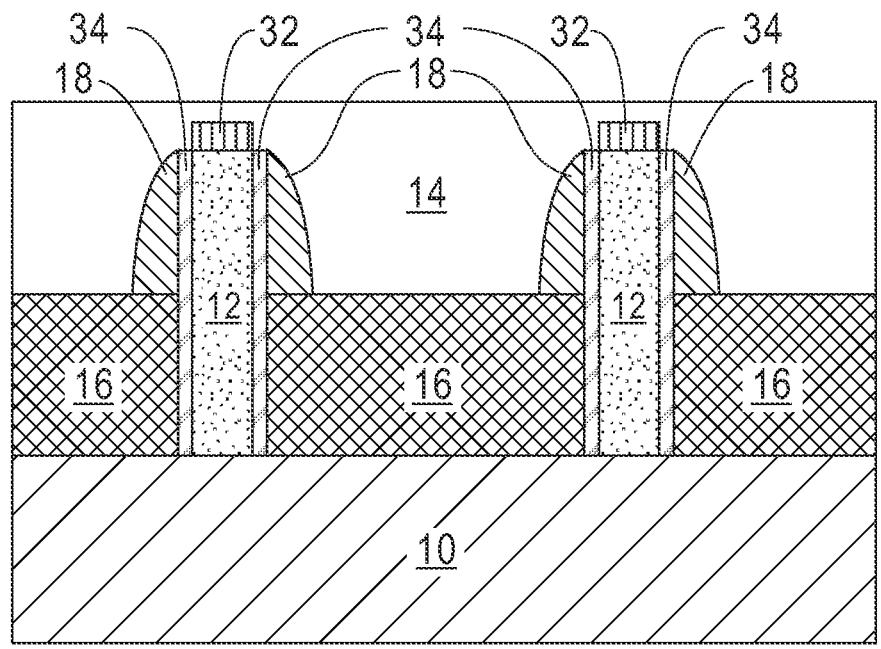
FIG. 12 is a cross sectional view of the second exemplary semiconductor structure of FIG. 11 after forming an isolation structure on a portion of the substrate and in contact with a sidewall surface of the sacrificial structure, and forming a dielectric spacer on an upper portion of exposed sidewall surfaces of each semiconductor fin.

Referring now to FIG. 12, there is illustrated the second exemplary semiconductor structure of FIG. 11 after forming an isolation structure 16 on a portion of the substrate 10 and in contact with a sidewall surface of the sacrificial structure 14 and sidewall surfaces of each semiconductor 12, and forming a dielectric spacer 18 on an upper portion of exposed sidewall surfaces of each semiconductor fin 12 and on a topmost surface of the isolation structure 16.

The isolation structure 16 of this embodiment of the present includes one of the trench dielectric materials mentioned above in providing the isolation structure 16 to the first exemplary semiconductor structure shown in FIG. 3. The isolation structure 16 of this embodiment of the present application can be formed utilizing the technique mentioned above for providing the isolation structure 16 to the first exemplary semiconductor structure shown in FIG. 3. As shown, the height of the isolation structure 16 is below the height of both the sacrificial structure 14 and each semiconductor fin 12.

The dielectric spacer 18 of this embodiment of the present includes one of the dielectric spacer materials mentioned above in providing the dielectric spacer 18 to the first exemplary semiconductor structure shown in FIG. 4. The dielectric spacer 18 of this embodiment of the present application can be formed utilizing the technique mentioned above for providing the dielectric spacer 18 to the first exemplary semiconductor structure shown in FIG. 4.

Figure 13:
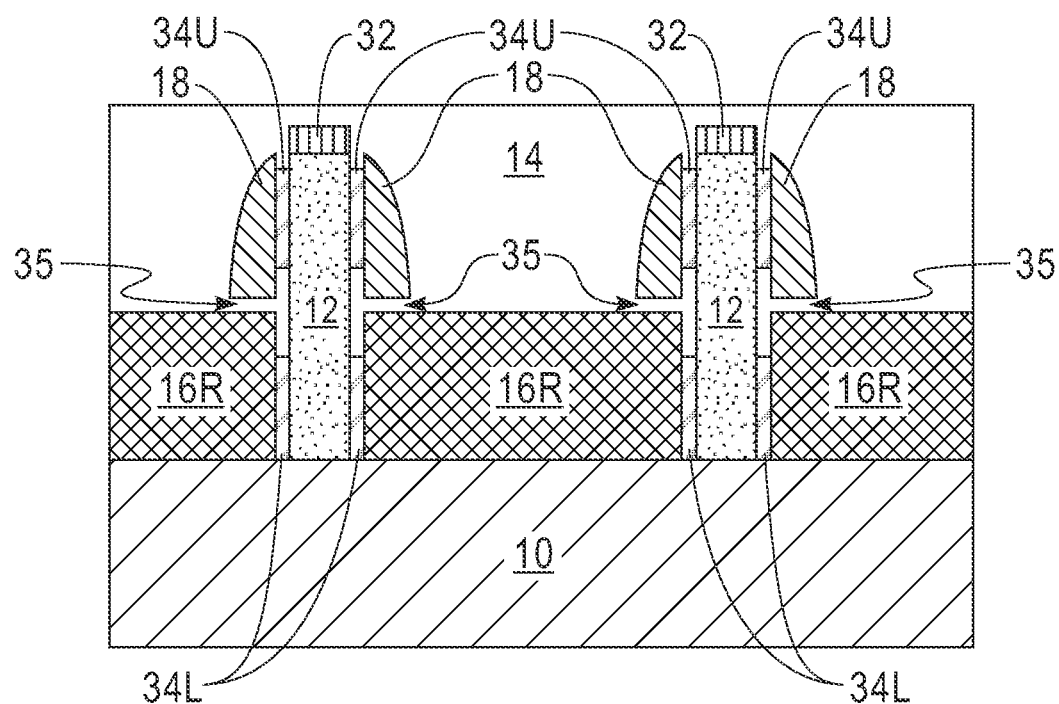
FIG. 13 is a cross sectional view of the second exemplary semiconductor structure of FIG. 12 after recessing the isolation structure and exposing a middle portion of the sidewall surfaces of each semiconductor fin.

Referring to FIG. 13, there is illustrated the second exemplary semiconductor structure of FIG. 12 after recessing the isolation structure 16 and exposing a middle portion of the sidewall surfaces of each semiconductor fin 12. The remaining portion of the isolation structure 16 may be referred to herein as a recessed isolation structure 16R. Recessing provides a gap 35 between the dielectric spacer 18 and the recessed isolation structure 16R that exposes a portion of the sacrificial oxide liner 34 that is located at a middle portion of each semiconductor fin 12. In one embodiment, the gap 35 has a height, as measured from the topmost surface of the recessed isolation structure 16R to the bottommost surface of dielectric spacer 18, which is from 2 nm to 10 nm. The recessing of the isolation structure 16 that provides recessed isolation structure 16R comprises an etching process that is selective in removing the trench dielectric material that provides the isolation structure 16. In one embodiment, the recess etch may be performed utilizing either hydrofluoric acid or a buffered oxide etchant (i.e., a mixture of ammonia fluoride and hydrofluoric acid).

A middle portion of the sidewall surfaces of each semiconductor fin 12 is then exposed by removing a portion of the sacrificial oxide liner 24 that is exposed by gap 35. This step provides an upper sacrificial oxide liner portion 34U and a lower sacrificial oxide liner portion 34L. The upper sacrificial oxide liner portion 34U has a topmost surface that is located beneath a topmost surface of each semiconductor fin 12 and each dielectric spacer 18. The upper sacrificial oxide liner portions 34U also has a bottommost surface that is located above a bottommost surface of each dielectric spacer 18. The lower sacrificial oxide portion 24L has a topmost surface that is typically located beneath the topmost surface of the recessed isolation structure 16R. The exposing of a middle portion of the sidewall surfaces of each semiconductor fin 12 may be performed utilizing an etching process such as, for example buffered hydrofluoric acid.

Figure 14:
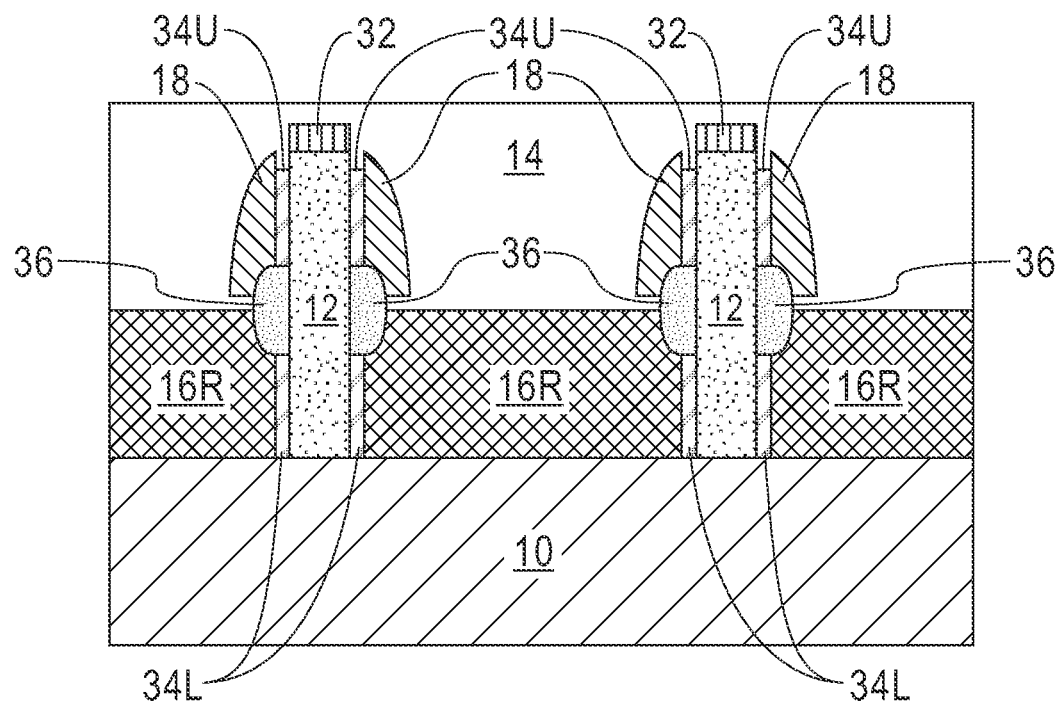
FIG. 14 is a cross sectional view of the second exemplary semiconductor structure of FIG. 13 after growing an oxide region from the exposed middle portion of the sidewall surfaces of each semiconductor fin.

Referring now to FIG. 14, there is illustrated the second exemplary semiconductor structure of FIG. 13 after growing an oxide region 36 from the exposed middle portion of the sidewall surfaces of each semiconductor fin 12. Each oxide region 36 that is formed contacts the middle portion of the sidewall surfaces of one of the semiconductor fins 12, a bottommost surface of one of the dielectric spacers 18, a bottommost surface of one of the upper sacrificial oxide liner portion 34U, a topmost surface of the recessed isolation structure 16R and a topmost surface of one of the lower sacrificial oxide liner portion 34L. The oxide region 36 typically has a first width that does not extend beyond the outermost edge of dielectric spacer 18. In one embodiment, the first width of the oxide region 36 is from 10 nm to 30 nm. The oxide region 36 may comprise a same material as the upper and lower sacrificial oxide liner portions 34U, 34L. The oxide region 36 may be formed by a thermal oxidation process.

Figure 15:
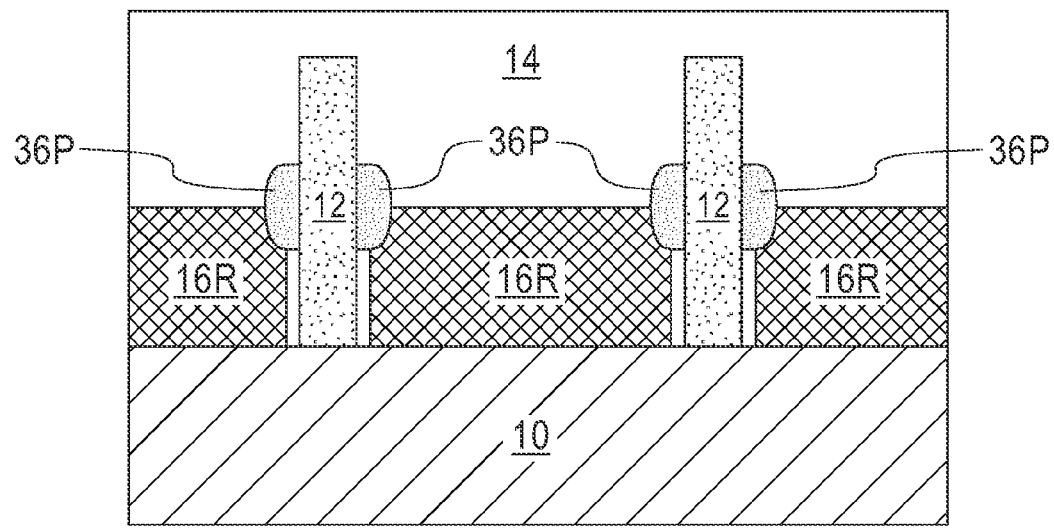
FIG. 15 is a cross sectional view of the second exemplary semiconductor structure of FIG. 14 after removing the dielectric spacers and remaining portions of the sacrificial dielectric liner.

Referring now to FIG. 15, there is illustrated the second exemplary semiconductor structure of FIG. 14 after removing each dielectric spacer 18 and remaining portions of the sacrificial oxide liner (i.e., the upper and lower sacrificial oxide liner portions 34U, 34L). During the removal of the remaining portions of the sacrificial oxide liner (i.e., the upper and lower sacrificial oxide liner portions 34U, 34L), the first width of the oxide region 36 may reduced to a second width that can be from 1 nm to 5 nm. The remaining portion of the oxide region 36 can be referred to herein as oxide spacer portion 36P; the dielectric oxide portion 36P can also be simply referred to as a dielectric spacer portion. Each oxide spacer portion 36P is located on a middle portion of each semiconductor fin 12 and thus divides the semiconductor fins 12 to have an upper portion with exposed sidewall surfaces and a topmost surface, and a lower portion with exposed sidewall surfaces. Each oxide spacer portion 36P has a surface that directly contacts a middle portion of each sidewall surface of each semiconductor fin 12 and extends outwards from the middle portion of the semiconductor fin 12.

The removal of each dielectric spacer 18 can be performed utilizing an etch that is selective in remove the dielectric spacer material that provides each dielectric spacer 18. In one embodiment of the present application, and when the dielectric spacer material that provides each dielectric spacer 18 comprises silicon nitride, a hot phosphoric acid etchant can be used. In some embodiments, the etch used to remove the dielectric spacer 18 also removes the hard mask cap 32 from atop the semiconductor fin 12. In other embodiments, a separate etch may be used to remove the hard mask cap 32 from atop the semiconductor fin 12.

The remaining portions of the sacrificial oxide liner (i.e., the upper and lower sacrificial oxide liner portions 34U, 34L) can be removed utilizing an etch such as, for example, a chemical oxide removal (COR) process that may include utilizing HF as an etchant. As mentioned above, this etch may also form oxide spacer portions 36P. In some embodiments, an additional etch may be used to provide the oxide spacer portions 36P.

Figure 16:
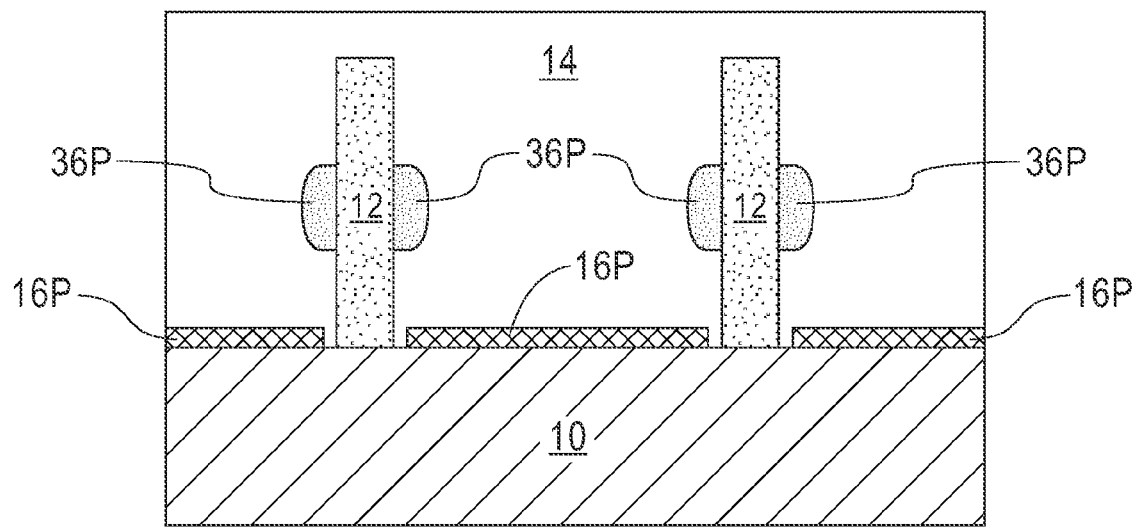
FIG. 16 is a cross sectional view of the second exemplary semiconductor structure of FIG. 15 after further recessing the isolation structure.

Referring now to FIG. 16, there is illustrated the second exemplary semiconductor structure of FIG. 15 after further recessing the isolation structure, i.e., recessed isolation structure 16R. The portion of the recessed isolation structure 16R that remains after this further recessing step may be referred to herein as isolation structure portion 16P. The isolation structure portion 16P has a height that is less than the height of the recessed isolation structure 16R prior to the further recessing.

The recessing is performed utilizing an etching process that is selective in removing the trench dielectric material that provides the isolation structure 16. In one embodiment, the recess etch may be performed utilizing either hydrofluoric acid or a buffered oxide etchant (i.e., a mixture of ammonia fluoride and hydrofluoric acid).

Figure 17:
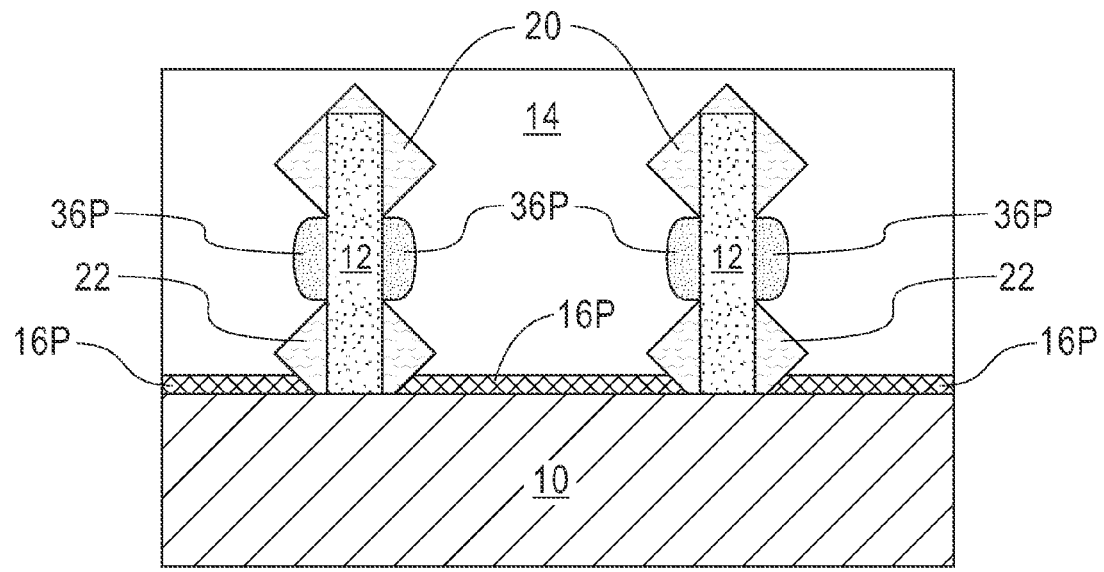
FIG. 17 is a cross sectional view of the second exemplary semiconductor structure of FIG. 16 after forming source/drain structures that include an upper source/drain portion and a lower source/drain portion that are separated by a remaining portion of the oxide region.

Referring now to FIG. 17, there is illustrated the second exemplary semiconductor structure of FIG. 16 after forming source/drain structures that include an upper source/drain portion 20 and a lower source/drain portion 22 that are separated by a remaining portion of the oxide region (i.e., oxide portion 36P). The source/drain structures (20, 22) that are formed in this embodiment of the present application are the same as those described above in providing the source/drain structures (20, 22) to the first exemplary semiconductor structure shown in FIG. 7. As such, the above description for the source/drain structure (20, 22) applied here for the source/drain structures (20, 22) for this embodiment of the present application. In accordance with an aspect of the present application, the source/drain structure (20, 22) of a semiconductor fin 12 does not merge with a source/drain structure (20, 22) of each nearest neighboring semiconductor fin 12. Also, each upper source/drain region 20 is spaced apart from a corresponding lower source/drain portion 22.

The upper source/drain portion 20 and the lower source/drain portion 22 have a faceted topmost surface. By "faceted topmost surface" it is meant that the topmost surface of the upper and lower source/drain portions 20, 22 are non-planar. In one embodiment of the present application, the upper source/drain portion 20 of each source/drain structure can be diamond shaped. In this embodiment, the upper source/drain portion 20 extends atop the exposed topmost surface of each semiconductor fin 12. The lower source/drain portion 22 of each source/drain structure can also be diamond shaped. Thus, and in some embodiments, the source/drain structures (20, 22) that are formed in the present application may be referred to as a double diamond shaped source/drain structure. The source/drain structure (20, 22) of the present application, including the double diamond shaped source/drain regions (20, 22), provide a more uniform dopant distribution along the sidewalls of each semiconductor fin 12 as compared to prior art approaches in which a spacer is formed at the bottom of each semiconductor fin prior to epitaxial formation of the source/drain structures.

As is shown, a bottommost surface of each upper source/drain portion 20 of each source/drain structure contacts a topmost surface of an oxide portion 36P, while a topmost surface of each lower source/drain portion 22 contacts a bottommost surface of an oxide portion 36P.

Figure 18:
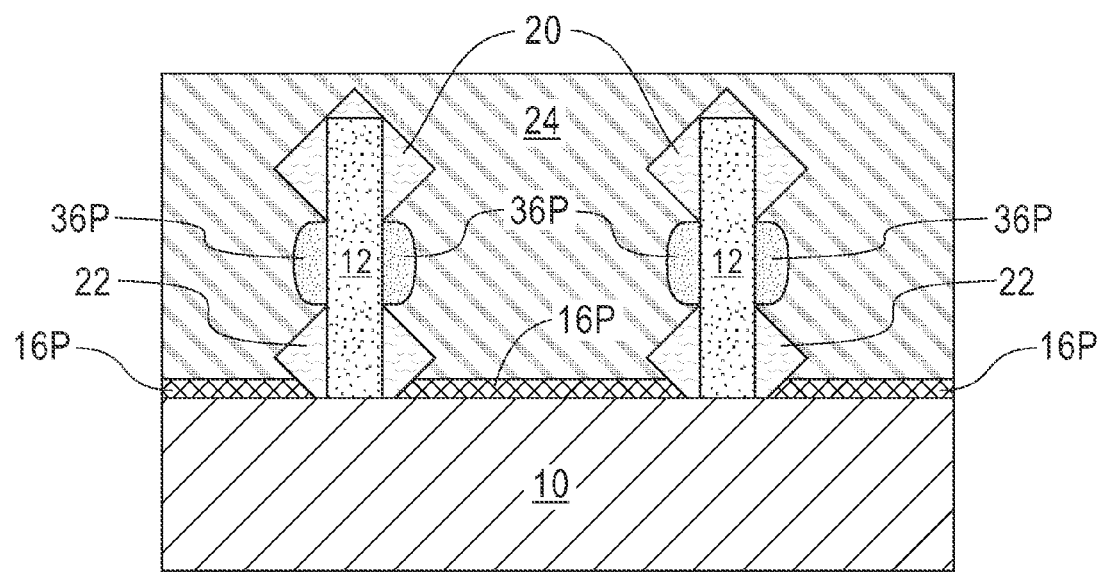
FIG. 18 is a cross sectional view of the second exemplary semiconductor structure of FIG. 17 after replacing the sacrificial structure with a functional gate structure.

Referring now to FIG. 18, there is illustrated the second exemplary semiconductor structure of FIG. 17 after replacing the sacrificial structure 14 with a functional gate structure 24. The replacement of the sacrificial structure 14 with the functional gate structure 24 can be performed utilizing the processing mentioned above in providing the first exemplary semiconductor structure shown in FIG. 8. The functional gate structure 24 of this embodiment of the present application includes the same materials as mentioned above for providing the functional gate structure 24 shown in the first exemplary semiconductor structure shown in FIG. 8.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a semiconductor fin extending upwards from a surface of a substrate; and
   a source/drain structure located on each side of the semiconductor fin, wherein said source/drain structure comprises an upper source/drain portion having a faceted topmost surface and located on an upper portion of said semiconductor fin, and a lower source/drain portion having a faceted topmost surface and located on a lower portion of said semiconductor fin, wherein said upper source/drain portion of said source/drain structure is spaced apart from said lower source/drain portion of said source/drain structure by a dielectric spacer portion.

2. The semiconductor structure of claim 1, wherein said upper source/drain portion contacts a sidewall surface and a topmost surface of said upper portion of said semiconductor fin.

3. The semiconductor structure of claim 1, wherein said upper source/drain portion and said lower source/drain portion are both diamond shaped.

4. The semiconductor structure of claim 1, further comprising an isolation structure portion located on said substrate and at a footprint of said semiconductor fin.

5. The semiconductor structure of claim 1, further comprising a functional gate structure straddling a portion of said semiconductor fin and located between each source/drain structure.

6. The semiconductor structure of claim 1, wherein said dielectric spacer portion has a surface that directly contacts a middle portion of each sidewall surface of said semiconductor fin and extends outwards from said middle portion of said semiconductor fin.

7. The semiconductor structure of claim 1, wherein said substrate is an insulator layer of a semiconductor-on-insulator substrate or a remaining semiconductor material portion of a bulk semiconductor substrate.

8. The semiconductor structure of claim 1, further comprises at least one other semiconductor fin located adjacent to said semiconductor fin, wherein said at least one other semiconductor fin comprises another source/drain structure comprising an another upper source/drain portion having a faceted topmost surface and located on an upper portion of said at least one other semiconductor fin, and another lower source/drain portion having a faceted topmost surface and located on a lower portion of said at least one other semiconductor fin, wherein said another upper source/drain portion of said another source/drain structure is spaced apart from said another lower source/drain portion of said another source/drain structure by another dielectric spacer portion.

9. The semiconductor structure of claim 2, wherein said lower source/drain portion contacts a sidewall surface of said lower portion of said semiconductor fin.

10. The semiconductor structure of claim 8, wherein said source/drain structure and said another source/drain structure are unmerged.

11. A method of forming a semiconductor structure, said method comprising:
providing a semiconductor fin extending upwards from a surface of a substrate;
forming a sacrificial structure straddling a portion of said semiconductor fin;
forming a dielectric spacer portion on a middle portion of each sidewall surface of said semiconductor fin not including said sacrificial structure; and
epitaxially growing a source/drain structure comprising an upper source/drain portion having a faceted topmost surface on an upper portion of said semiconductor fin not including said sacrificial structure, and a lower source/drain portion having a faceted topmost surface on a lower portion of said semiconductor fin not including said sacrificial structure, wherein said upper source/drain portion of said source/drain structure is spaced apart from said lower source/drain portion of said source/drain structure by said dielectric spacer portion.

12. The method of claim 11, further comprising replacing said sacrificial structure with a functional gate structure.

13. The method of claim 11, wherein said forming said semiconductor fin comprises:
providing a semiconductor substrate having a topmost semiconductor material; and
patterning said topmost semiconductor material.

14. The method of claim 13, wherein said forming said dielectric spacer portion comprises:
forming an isolation structure at a footprint of said semiconductor fin not including said sacrificial structure, wherein said isolation structure has a height that is less than a height of said semiconductor fin;
forming a dielectric spacer on a topmost surface of said isolation structure and contacting each exposed sidewall surface of said semiconductor fin not including said sacrificial structure;
recessing each dielectric spacer to provide said dielectric spacer portion and to expose said upper portion of said semiconductor fin; and
recessing said isolation structure to expose said lower portion of said semiconductor fin.

15. The method of claim 13, further comprising forming a hard mask layer atop said semiconductor material prior to patterning.

16. The method of claim 15, further comprising forming a sacrificial oxide liner on each sidewall surface of said semiconductor fin prior to forming said sacrificial structure.

17. The method of claim 16, wherein said forming said dielectric spacer portion comprises:
forming an isolation structure at a footprint of said semiconductor fin not including said sacrificial structure, wherein said isolation structure has a height that is less than a height of said semiconductor fin;
forming a dielectric spacer on a topmost surface of said isolation structure and contacting a sidewall surface of each sacrificial oxide liner that is present on said semiconductor fin not including said sacrificial structure;
recessing said isolation structure to provide a gap between a bottommost surface of said dielectric spacer and a topmost surface of a remaining portion of said isolation structure;
exposing a middle portion of each sidewall surface of said semiconductor fin by removing a portion of said sacrificial oxide liner;
growing an oxide region from said exposed middle portion of each sidewall surface of said semiconductor fin; and
removing each dielectric spacer and remaining portions of said sacrificial oxide liner, wherein during said removing said remaining portions of said sacrificial oxide liner said oxide region is recessed to provide said dielectric spacer portion.

18. The method of claim 17, wherein said hard mask cap is removed during said removing each dielectric spacer.

19. The method of claim 17, further comprising performing another recess of said isolation structure.

20. The method of claim 17, wherein said removing said remaining portions of said sacrificial oxide liner comprises a chemical oxide removal process.

* * * * *